United States Patent
Wu et al.

(10) Patent No.: US 9,208,892 B2
(45) Date of Patent: Dec. 8, 2015

(54) OPERATION METHOD OF MULTI-LEVEL MEMORY

(71) Applicant: MACRONIX International Co., Ltd., Hsinchu (TW)

(72) Inventors: Guan-Wei Wu, Hsinchu (TW); Yao-Wen Chang, Hsinchu (TW); I-Chen Yang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 239 days.

(21) Appl. No.: 13/943,691

(22) Filed: Jul. 16, 2013

(65) Prior Publication Data

US 2015/0023098 A1    Jan. 22, 2015

(51) Int. Cl.
*G11C 16/04* (2006.01)
*G11C 16/26* (2006.01)
*G11C 16/34* (2006.01)

(52) U.S. Cl.
CPC ............ *G11C 16/26* (2013.01); *G11C 16/0475* (2013.01); *G11C 16/3422* (2013.01)

(58) Field of Classification Search
CPC .... G11C 16/10; G11C 16/26; G11C 16/0408; G11C 16/0441; G11C 16/0466; G11C 16/12; G11C 16/0433; G11C 16/0483; G11C 16/0475; G11C 16/28; G11C 16/3422
See application file for complete search history.

(56) References Cited

U.S. PATENT DOCUMENTS

| | | | |
|---|---|---|---|
| 5,486,714 | A | 1/1996 | Hong |
| 6,057,574 | A | 5/2000 | Hisamune |
| 6,127,226 | A | 10/2000 | Lin et al. |
| 7,923,768 | B2 | 4/2011 | Park |
| 2007/0159880 | A1 * | 7/2007 | Eitan .............................. 365/184 |
| 2009/0073760 | A1 * | 3/2009 | Betser et al. ................ 365/185.2 |
| 2010/0302855 | A1 | 12/2010 | Yang et al. |
| 2012/0091424 | A1 * | 4/2012 | Lin et al. ............................. 257/4 |
| 2012/0155168 | A1 * | 6/2012 | Kim et al. ................. 365/185.03 |
| 2012/0300554 | A1 * | 11/2012 | Goss et al. ................ 365/185.33 |

FOREIGN PATENT DOCUMENTS

TW        I267088        11/2006

OTHER PUBLICATIONS

Office Action of related U.S. Appl. No. 13/088,240, issued on Nov. 6, 2013, p. 1-p. 7.

* cited by examiner

*Primary Examiner* — Hashem Farrokh
(74) *Attorney, Agent, or Firm* — J.C. Patents

(57) ABSTRACT

An operation method of a multi-level memory is provided. A first read voltage lower than a standard read voltage is applied to a doped region in a substrate at one side of a control gate of the memory, so as to determine whether a first storage position and a second storage position are both at the lowest level.

12 Claims, 4 Drawing Sheets

OPERATION METHOD OF MULTI-LEVEL MEMORY

BACKGROUND OF THE INVENTION

1. Field of Invention

The present invention relates to an operation method of a memory, and more particularly to an operation method of a multi-level memory.

2. Description of Related Art

The memory size is larger and larger along with increasing sizes of application software of a computer. Therefore, the conventional memory device for storing a bit or two bits can not satisfy the current demands. In this regard, a memory device able to store multi-bit data is provided in recent years, which is termed as a multi-level memory.

Generally, in a multi-level memory with two storage positions, in order to determine the level of one storage position, a standard read voltage is usually applied to one doped region adjacent to another storage position. However, when the another storage position adjacent to the one doped region is not stored with charges (i.e. the another storage position is at the lowest level), the generated current upon the application of the standard read voltage may cause a serious read disturbance and thereby affect the accuracy of the read level. Besides, when the two storage positions are not stored with charges (i.e. the two storage positions are both at the lowest level), such read disturbance is particularly serious.

SUMMARY OF THE INVENTION

Accordingly, the present invention provides an operation method of a multi-level memory, in which the reading operation of the multi-level memory can be performed without read disturbance.

The present invention provides an operation method of a multi-level memory. The method is suitable for a multi-level memory having a first storage position and a second storage position. Multiple levels of the multi-level memory correspond to different read current values and the multi-level memory includes a substrate, a control gate, a charge storage layer located between the substrate and the control gate, and a plurality of doped regions located in the substrate beside the control gate. The operation method includes the following steps. A first read voltage lower than a standard read voltage is applied to one of the doped regions in the substrate at one side of the control gate, so as to determine whether the first storage position and the second storage position are both at a lowest level.

According to an embodiment of the present invention, when the first storage position and the second storage position are not at the lowest level, a second read voltage lower than the standard read voltage is applied to the doped region adjacent to the first storage position, so as to determine a level of the second storage position.

According to an embodiment of the present invention, if the second storage position is at the lowest level, a third read voltage lower than the standard read voltage is applied to the doped region adjacent to the second storage position, so as to determine a level of the first storage position.

According to an embodiment of the present invention, if the second storage position is not at the lowest level, the standard read voltage is applied to the doped region adjacent to the second storage position, so as to determine a level of the first storage position.

According to an embodiment of the present invention, when the first read voltage is applied to one of the doped regions in the substrate at one side of the control gate and a maximum current value is read, the first storage position and the second storage position are both determined to be at the lowest level.

According to an embodiment of the present invention, the first read voltage is about ½ and ⅔ of the standard read voltage.

According to an embodiment of the present invention, the second read voltage is about ½ and ⅔ of the standard read voltage.

According to an embodiment of the present invention, the third read voltage is about ½ and ⅔ of the standard read voltage.

According to an embodiment of the present invention, the standard read voltage ranges from about 1.1 V to 1.8 V.

According to an embodiment of the present invention, the first read voltage ranges from about 0.5 V to 1.1 V.

According to an embodiment of the present invention, the second read voltage ranges from about 0.5 V to 1.1 V.

According to an embodiment of the present invention, the third read voltage ranges from about 0.5 V to 1.1 V.

In view of the above, in the operation method of the multi-level memory of the invention, a reading operation is performed with a read voltage (lower than a commonly used standard read voltage) to exclude the case that the first storage position and the second storage position are both at the lowest level. Thereafter, another read voltage (lower than the commonly used standard read voltage) is applied to determine a level of the second storage position, and the read voltage for the first storage position is adjusted according to the level of the second storage position. In such manner, during the reading operation, the level of the first storage position can be determined without read disturbance.

In order to make the aforementioned and other objects, features and advantages of the present invention comprehensible, a preferred embodiment accompanied with figures is described in detail below.

DESCRIPTION OF EMBODIMENTS

The present invention provides an operation method of a multi-level memory, in which the reading operation of the multi-level memory can be performed without read disturbance. The operation method is suitable for a multi-level memory with two storage positions, and the details are described below.

Figure 1:
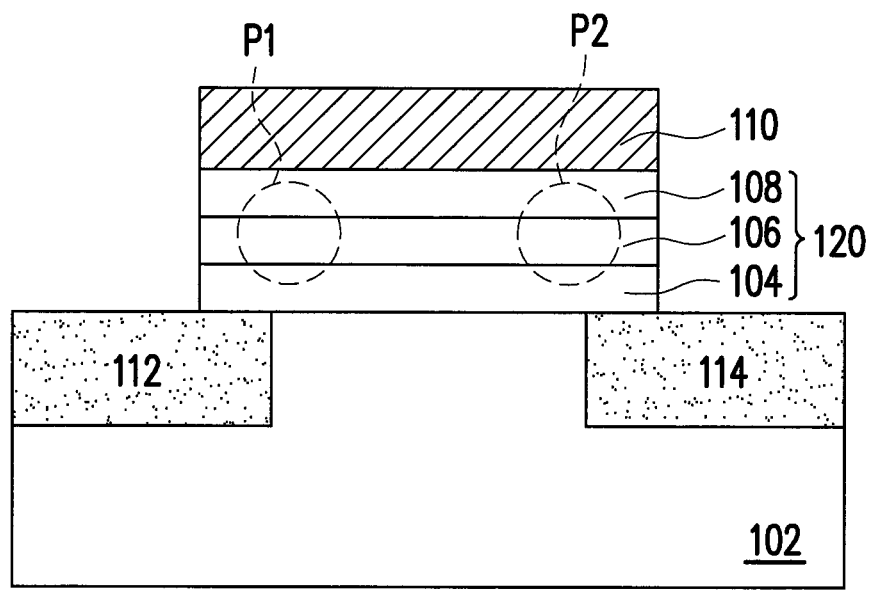
FIG. 1 is a schematic view of a multi-level memory according to an embodiment of the present invention.

FIG. 1 is a schematic view of a multi-level memory according to an embodiment of the present invention.

Referring to FIG. 1, a multi-level memory 100 includes a substrate 102, a bottom oxide layer 104 located on the substrate 102, a silicon nitride layer 106 serving as a charge trapping layer and located on the bottom oxide layer 104, a top oxide layer 108 located on the silicon nitride layer 106, a control gate 110 located on the top oxide layer 108, and doped regions 112 and 114 located in the substrate 102 beside the control gate 110. The doped regions 112 and 114 can respectively serve as a source region and a drain region of the multi-level memory 100.

In this embodiment, the bottom oxide layer 104, the silicon nitride layer 106 and the top oxide layer 108 of the multi-level memory 100 constitute a charge storage layer 120. Besides, the multi-level memory 100 has a first storage position P1 and a second storage position P2 located in the charge storage layer 120. In addition, multiple levels of the multi-level memory 100 correspond to different read current values.

The operation method of the multi-level memory of the invention is described in detail as follows.

Figure 2:
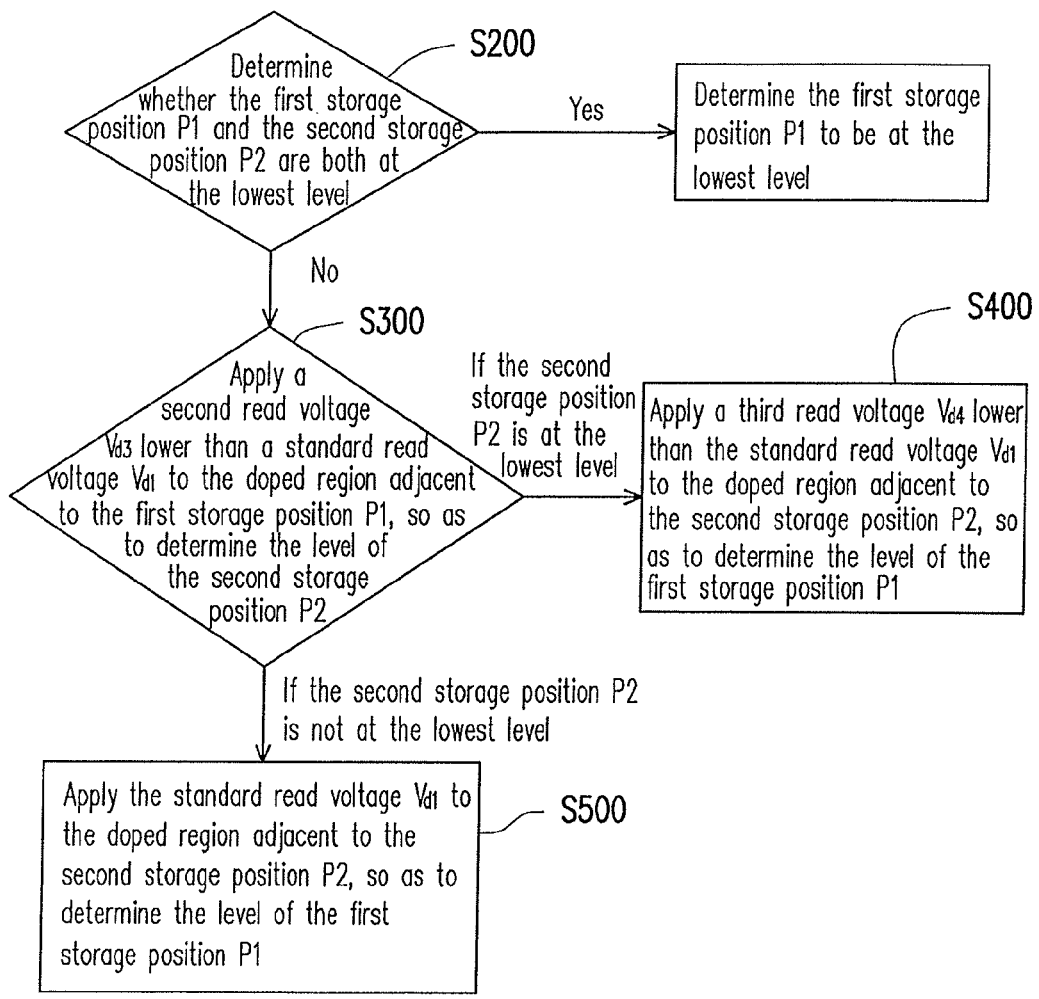
FIG. 2 is an operation process flow of a multi-level memory according to an embodiment of the present invention.

FIG. 2 is an operation process flow of a multi-level memory according to an embodiment of the present invention. FIG. 3A to FIG. 3D are respective schematic views of different operation steps of the multi-level memory in FIG. 2. It is noted that the operation method of this embodiment is for reading the level of the first storage position P1, but the present invention is not limited thereto. In another embodiment, the operation method of the invention can be performed to read the level of the second storage position P2.

Herein, the term "the lowest level" defines the level of the storage position when no charge is stored therein. The term "standard read voltage" defines a voltage from which the current is generated may cause a read disturbance when the two storage positions are both at the lowest level.

Figure 3A:
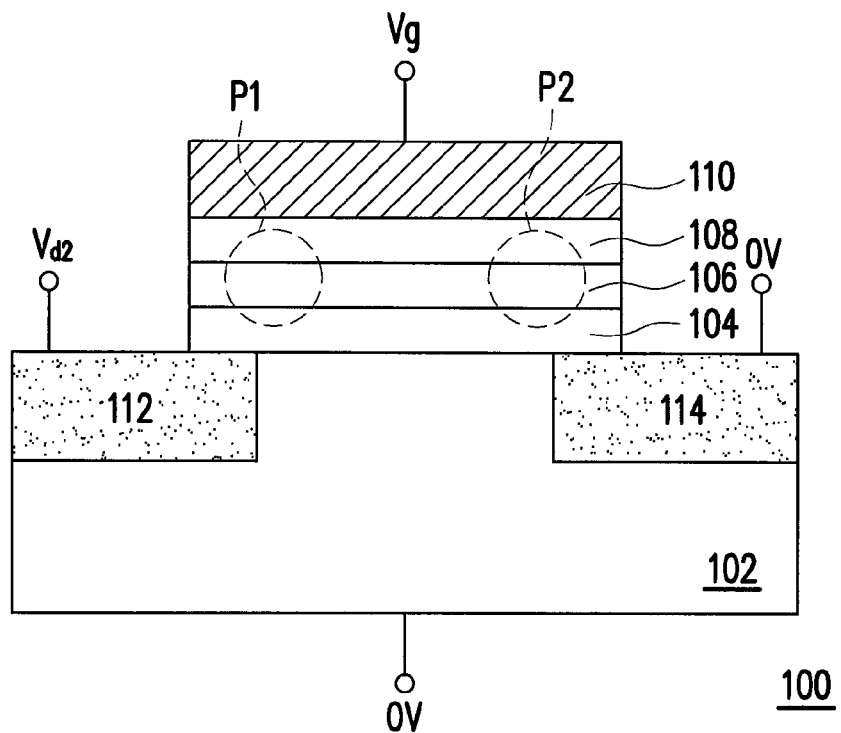
FIG. 3A to FIG. 3D are respective schematic views of different operation steps of the multi-level memory in FIG. 2.

Referring to FIG. 2 and FIG. 3A, a step S200 is implemented to determine whether the first storage position P1 and the second storage position P2 are both at the lowest level. The step S200 includes applying 0 V to the substrate 102, applying a gate voltage $V_g$ to the control gate 110, applying a first read voltage $V_{d2}$ lower than a standard read voltage $V_{d1}$ to the doped region 112 and applying 0 V to the doped region 114. Accordingly, the read current value can be used to determine whether the first storage position P1 and the second storage position P2 are both at the lowest level. Specifically, when both of the first storage position P1 and the second storage position P2 are not stored with charges, the maximum current value can be read after a read voltage is applied. Therefore, in the step S200, if the maximum current value is read, the first storage position P1 and the second storage position P2 are determined to be both at the lowest level. On the contrary, if the maximum current value is not read, it is determined that the first storage position P1 and the second storage position P2 are not both at the lowest level, and a step S300 is then implemented.

Besides, in the step S200, the first read voltage $V_{d2}$ lower than the standard read voltage $V_{d1}$ is applied to the doped region 112. In such case, read disturbance caused by the generated current (with the maximum current value) when the first storage position P1 and the second storage position P2 are both at the lowest level can be avoided. In other words, in the step S200, the first storage position P1 is determined to be at the lowest level without read disturbance.

In an embodiment, the first read voltage $V_{d2}$ is about ½ to ⅔ of the standard voltage $V_{d1}$. In addition, in an embodiment, the gate voltage $V_g$ ranges from about 3.5 V to 4.5 V, the standard read voltage $V_{d1}$ ranges from about 1.1 V to 1.8 V, and the first read voltage $V_{d2}$ ranges from about 0.5 V to 1.1 V. However, the present invention is not limited thereto. The said voltage values can be adjusted upon the type and structure of the multi-level memory in actual use, as long as the generated current does not cause a read disturbance when the first storage position P1 and the second storage position P2 are both at the lowest level.

Moreover, the step S200 of this embodiment in which the first read voltage $V_{d2}$ is applied to the doped region 112 is provided for illustration purposes, and is not construed as limiting the present invention. In another embodiment, in the step S200, the first read voltage $V_{d2}$ can be applied to the doped region 114, so as to determine whether the first storage position P1 and the second storage position P2 are both at the lowest level.

Figure 3B:
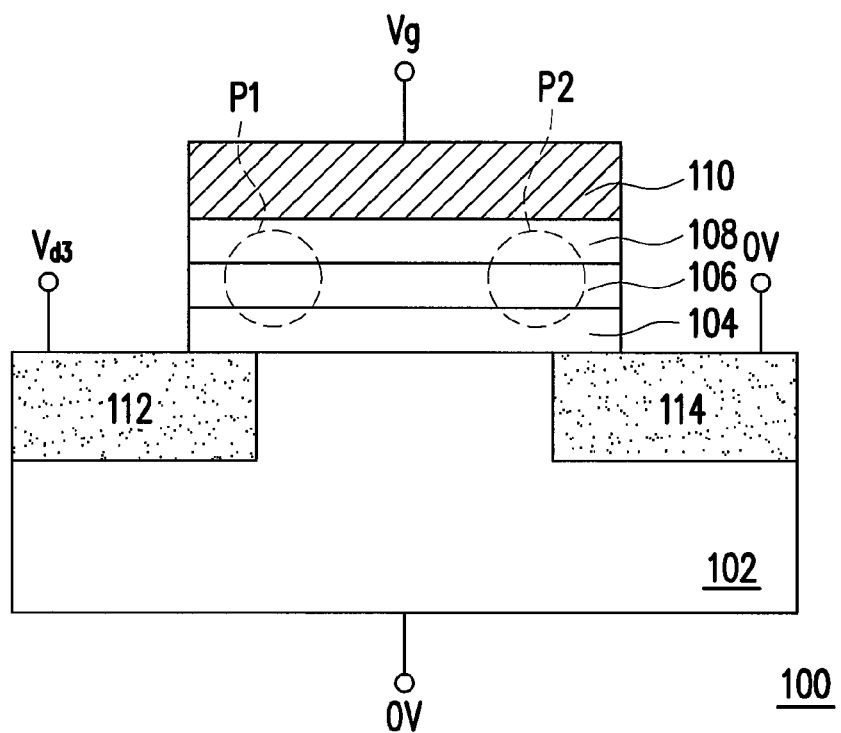

Referring to FIG. 2 and FIG. 3B, in the step S300, a second read voltage $V_{d3}$ lower than the standard read voltage $V_{d1}$ is applied to the doped region 112 adjacent to the first storage position P1, so as to determine the level of the second storage position P2. The step S300 includes applying 0 V to the substrate 102, applying a gate voltage $V_g$ to the control gate 110, applying 0 V to the doped region 114 and applying a second read voltage $V_{d3}$ lower than a standard read voltage $V_{d1}$ to the doped region 112. Accordingly, the read current value can be used to determine the level of the second storage position P2.

Specifically, the operation method of this embodiment is used to determine the level of the first storage position P1. Thus, in this step S300, according to the read current value, if the second storage position P2 is determined to be at the lowest level, go to the step S400; while if the second storage position P2 is determined to be not at the lowest level, go to the step S500.

Besides, in the step S300, although the first storage position P1 and the second storage position P2 are determined to be not both at the lowest level, it is possible that the first storage position P1 is at the lowest level. The second read voltage $V_{d3}$ lower than the standard read voltage $V_{d1}$ is applied to the doped region 112, so as to avoid read disturbance caused by the generated current when the first storage position P1 is at the lowest level. In other words, in the step S300, the level of the second storage position P2 can be determined without read disturbance.

In an embodiment, the second read voltage $V_{d3}$ is about ½ to ⅔ of the standard voltage $V_{d1}$. In addition, in an embodiment, the gate voltage $V_g$ ranges from about 3.5 V to 4.5 V, the standard read voltage $V_{d1}$ ranges from about 1.1 V to 1.8 V, and the second read voltage $V_{d2}$ ranges from about 0.5 V to 1.1 V. However, the present invention is not limited thereto. The said voltage values can be adjusted upon the type and structure of the multi-level memory in actual use, as long as the level of the second storage position P2 can be accurately determined.

Figure 3C:
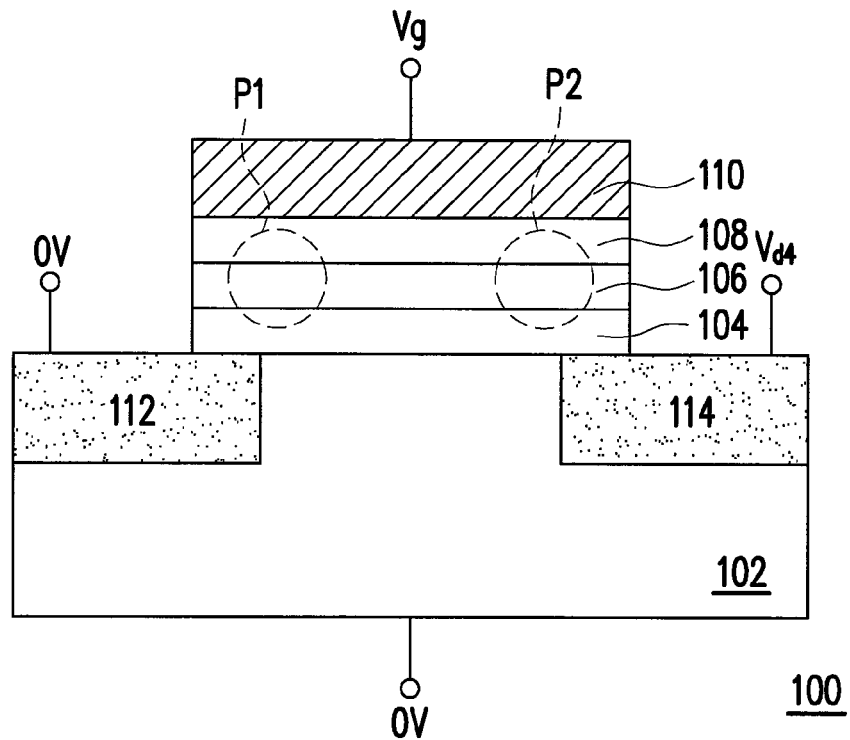
Figure 3D:
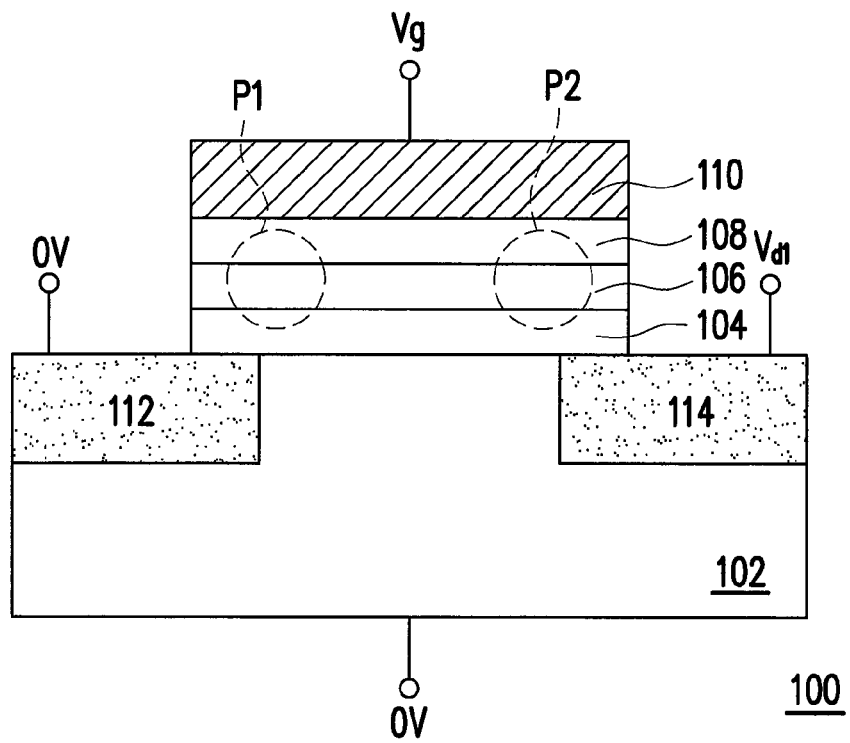

Referring to FIG. 2 and FIG. 3C, in the step S400, a third read voltage $V_{d4}$ lower than the standard read voltage $V_{d1}$ is applied to the doped region 114 adjacent to the second storage position P2, so as to determine the level of the first storage position P1. The step S400 includes applying 0 V to the substrate 102, applying a gate voltage $V_g$ to the control gate 110, applying a third read voltage $V_{d4}$ lower than a standard read voltage $V_{d1}$ to the doped region 114 and applying 0 V to the doped region 112. Accordingly, the read current value can be used to determine the level of the first storage position P1.

Specifically, in the case that the second storage position P2 is at the lowest level, the third read voltage $V_{d3}$ lower than the standard read voltage $V_{d1}$ is applied to the doped region 114, so as to avoid read disturbance during the reading operation and further accurately determine the level of the first storage position P1.

In an embodiment, the third read voltage $V_{d4}$ is about ½ to ⅔ of the standard voltage $V_{d1}$. In addition, in an embodiment, the gate voltage $V_g$ ranges from about 3.5 V to 4.5 V, the standard read voltage $V_{d1}$ ranges from about 1.1 V to 1.8 V, and the third read voltage $V_{d4}$ ranges from about 0.5 V to 1.1 V. However, the present invention is not limited thereto. The said voltage values can be adjusted upon the type and structure of the multi-level memory in actual use, as long as the level of the first storage position P1 can be accurately determined Referring to FIG. 2 and FIG. 3D, in the step S500, the standard read voltage $V_{d1}$ is applied to the doped region 114 adjacent to the second storage position P2, so as to determine the level of the first storage position P1. The step S500 includes applying 0 V to the substrate 102, applying a gate voltage $V_g$ to the control gate 110, applying the standard voltage $V_{d1}$ to the doped region 114 and applying 0 V to the doped region 112. Accordingly, the read current value can be used to determine the level of the first storage position P1.

Specifically, in the case that the second storage position P2 is not at the lowest level, the generated current upon the application of the standard read voltage $V_{d1}$ is lower than the current when the second storage position P2 is at the lowest level. Therefore, the read disturbance can be effectively reduced, so that the reading operation can be performed without read disturbance.

In an embodiment, in the step S500, the gate voltage $V_g$ ranges from about 3.5 V to 4.5 V, and the standard read voltage $V_{d1}$ ranges from about 1.1 V to 1.8V. However, the present invention is not limited thereto. The said voltage values can be adjusted upon the type and structure of the multi-level memory in actual use, as long as the level of the first storage position P1 can be accurately determined.

In summary, in the operation method of the multi-level memory of the said embodiments, a reading operation is performed with a first read voltage $V_{d2}$ to exclude the case that the first storage position P1 and the second storage position P2 are both at the lowest level. Thereafter, a second read voltage $V_{d3}$ is applied to determine a level of the second storage position P2, and the next applied voltage is adjusted according to the level of the second storage position P2. In such manner, during the reading operation, the level of the first storage position P1 can be determined without read disturbance.

This invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An operation method of a multi-level memory, suitable for a multi-level memory having a first storage position and a second storage position, wherein multiple levels of the multi-level memory correspond to different read current values and the multi-level memory comprises a substrate, a control gate, a charge storage layer located between the substrate and the control gate, and a plurality of doped regions located in the substrate beside the control gate, the operation method comprising:

applying a first read voltage lower than a standard read voltage to one of the doped regions in the substrate at one side of the control gate, so as to determine whether the first storage position and the second storage position are both at a lowest level, wherein the lowest level is defined as the level of the storage position when no charge is stored therein.

2. The operation method of claim 1, wherein when the first storage position and the second storage position are not at the lowest level, a second read voltage lower than the standard read voltage is applied to the doped region adjacent to the first storage position, so as to determine a level of the second storage position.

3. The operation method of claim 2, wherein if the second storage position is at the lowest level, a third read voltage lower than the standard read voltage is applied to the doped region adjacent to the second storage position, so as to determine a level of the first storage position.

4. The operation method of claim 2, wherein if the second storage position is not at the lowest level, the standard read voltage is applied to the doped region adjacent to the second storage position, so as to determine a level of the first storage position.

5. The operation method of claim 1, wherein when the first read voltage is applied to one of the doped regions in the substrate at one side of the control gate and a maximum current value is read, the first storage position and the second storage position are both determined to be at the lowest level.

6. The operation method of claim 1, wherein the first read voltage is ½ and ⅔ of the standard read voltage.

7. The operation method of claim 2, wherein the second read voltage is ½ and ⅔ of the standard read voltage.

8. The operation method of claim 3, wherein the third read voltage is ½ and ⅔ of the standard read voltage.

9. The operation method of claim 1, wherein the standard read voltage ranges from 1.1 V to 1.8 V.

10. The operation method of claim 1, wherein the first read voltage ranges from 0.5 V to 1.1 V.

11. The operation method of claim 2, wherein the second read voltage ranges from 0.5 V to 1.1 V.

12. The operation method of claim 3, wherein the third read voltage ranges from 0.5 V to 1.1 V.

* * * * *